(12) United States Patent
Ninomiya et al.

(10) Patent No.: US 10,249,553 B2
(45) Date of Patent: Apr. 2, 2019

(54) COOLING APPARATUS FOR A HEAT-GENERATING ELEMENT

(71) Applicant: NISSAN MOTOR CO., LTD., Yokohama-shi, Kanagawa (JP)

(72) Inventors: Gou Ninomiya, Kanagawa (JP); Motoyuki Furukawa, Tokyo (JP); Katsuhiko Kondo, Tokyo (JP)

(73) Assignee: Nissan Motor Co., Ltd., Yokohama-shi, Kanagawa (JP)

( * ) Notice: Subject to any disclaimer, the term of this patent is extended or adjusted under 35 U.S.C. 154(b) by 24 days.

(21) Appl. No.: 14/784,664

(22) PCT Filed: Mar. 26, 2014

(86) PCT No.: PCT/JP2014/058526
§ 371 (c)(1),
(2) Date: Oct. 15, 2015

(87) PCT Pub. No.: WO2014/171276
PCT Pub. Date: Oct. 23, 2014

(65) Prior Publication Data
US 2016/0064303 A1    Mar. 3, 2016

(30) Foreign Application Priority Data

Apr. 16, 2013   (JP) ................. 2013-085550

(51) Int. Cl.
*H01L 23/473* (2006.01)
*H01L 23/367* (2006.01)
*H01L 23/373* (2006.01)

(52) U.S. Cl.
CPC ........ *H01L 23/473* (2013.01); *H01L 23/3675* (2013.01); *H01L 23/3735* (2013.01); *H01L 2224/32225* (2013.01)

(58) Field of Classification Search
CPC ....... F28F 3/10; F28F 2230/00; H01L 23/473; H05K 7/20254
See application file for complete search history.

(56) References Cited

U.S. PATENT DOCUMENTS

| 2010/0232112 A1 | 9/2010 | Uechi et al. | |
| 2011/0067841 A1* | 3/2011 | Doo | H05K 7/20254 165/104.19 |
| 2013/0206371 A1* | 8/2013 | Fujita | H01L 23/473 165/104.28 |

FOREIGN PATENT DOCUMENTS

| JP | 2005-032904 A | 2/2005 |
| JP | 2006153169 A * | 6/2006 |

(Continued)

*Primary Examiner* — Len Tran
*Assistant Examiner* — Hans R Weiland
(74) *Attorney, Agent, or Firm* — Young Basile Hanlon & MacFarlane, P.C.

(57) ABSTRACT

A cooling apparatus for a heat-generating element includes: a heat sink on which the heat-generating element is mounted; a cooling component having a recess, the cooling component and the heat sink being faced and joined to each other so that the recess forms a coolant passage; and a sealing member provided between the heat sink and the cooling component so as to seal the coolant passage and separate an interior and exterior of the coolant passage. A first distance is longer than a second distance with regard to a distance between facing surfaces of the heat sink and the cooling component near the sealing member, the first distance being between the facing surfaces at an interior side of the coolant passage separated by the sealing member, and the second distance is a distance between the facing surfaces at an exterior side of the coolant passage separated by the sealing member.

6 Claims, 7 Drawing Sheets

(56) References Cited

FOREIGN PATENT DOCUMENTS

| | | | | |
|---|---|---|---|---|
| JP | 2006-303262 A | 11/2006 | | |
| JP | 2007-201225 A | 8/2007 | | |
| JP | 2007-250918 A | 9/2007 | | |
| JP | 2007250918 A | * 9/2007 | | |
| JP | 2011-198822 A | 10/2011 | | |
| JP | 2011198822 A | * 10/2011 | ............ | H01L 24/33 |
| WO | 2012056880 A1 | 5/2012 | | |

* cited by examiner

COOLING APPARATUS FOR A HEAT-GENERATING ELEMENT

CROSS REFERENCE TO RELATED APPLICATION

The present application claims priority to Japanese Patent Application No. 2013-085550 filed on Apr. 16, 2013, incorporated by reference in its entirety.

TECHNICAL FIELD

The present invention relates to a cooling apparatus for a heat-generating element.

BACKGROUND

As a cooling apparatus for a heat-generating element, there is known an apparatus which comprises a heat sink configured such that the heat-generating element is mounted on one surface of the heat sink and the generated heat is radiated from the other surface. For example, a cooling apparatus for a heat-generating element is disclosed which employs a direct cooling system configured such that a cooling component having a recess is arranged to face the heat sink and a coolant is made to flow in a coolant passage formed by the recess of the cooling component, thereby cooling the heat sink (Japanese Patent Application Publication No. 2007-250918 A).

In Japanese Patent Application Publication No. 2007-250918 A, a coating film is formed on the surface of the heat sink to prevent corrosion of the heat sink. Accordingly, there is a disadvantage in cost.

In the cooling apparatus for a heat-generating element using the above-described direct cooling system, when the sealing member is provided to seal between the heat sink and the cooling component, a small gap is formed between facing surfaces of the heat sink and the cooling component at the interior side of the coolant passage near the sealing position. In this case, the, coolant will stay in this gap and the staying of the coolant causes corrosion of the heat sink and the cooling component by the following reason. First, when the coolant stays in the above gap, the concentration of dissolved oxygen is constant in the coolant staying there. On the other hand, the concentration of dissolved oxygen will increase in the coolant flowing through other passes in the coolant passage because oxygen dissolves into the coolant while the coolant passes through components, such as a pump, which are connected with the cooling component in order to push out the coolant. This will cause a difference in the concentration of the dissolved oxygen in the coolant. If a difference in the concentration of the dissolved oxygen occurs, a concentration cell will be formed on the surface of the heat sink to cause local corrosion (crevice corrosion) of the heat sink. Moreover, as the local corrosion of the heat sink progresses, the pH of the coolant is lowered due to effect of metal ions dissolved from the heat sink, and the cooling component is also corroded. If the heat sink is dissolved and the cooling component is corroded, a plating layer or the like formed on a surface of the heat sink and/or of the cooling component will be delaminated. The delamination of the plating layer or the like causes the liquid leakage from the sealing position. In such a situation, Japanese Patent Application Publication No. 2007-250918 A has a disadvantage in cost because a coating film may have to be formed on the surface of the heat sink to prevent corrosion of the heat sink and the cooling component.

SUMMARY

Problems to be solved by the present invention include providing a cooling apparatus for a heat-generating element which can prevent, in a simplified manner at low cost, corrosion of a heat sink and a cooling component and leakage of coolant due to such corrosion when the coolant is made to flow in a coolant passage formed by the cooling component so as to cool the heat sink.

The present invention solves the problems by providing a cooling apparatus for a heat-generating element, comprising: a heat sink on which the heat-generating element is mounted; a cooling component having a recess, the cooling component and the heat sink being faced and joined to each other so as to the recess forms a coolant passage in which a coolant flows; and a sealing member provided between the heat sink and the cooling component so as to seal the coolant passage and separate an interior and exterior of the coolant passage, wherein a first distance is longer than a second distance with regard to a distance between facing surfaces of the heat sink and the cooling component near the sealing member, the first distance is a distance between the facing surfaces at an interior side of the coolant passage separated by the sealing member, and the second distance is a distance between the facing surfaces at an exterior side of the coolant passage separated by the sealing member.

The coolant can smoothly flow in the coolant passage near the sealing position when the coolant flows in the coolant passage formed by the cooling component so as to cool the heat sink. This can prevent the occurrence of a difference in the concentration of the dissolved oxygen in the coolant flowing in the coolant passage, and can prevent the formation of a concentration cell in the coolant passage. It is thus possible to prevent, in a simplified manner at low cost, corrosion of the heat sink and the cooling component and to prevent leakage of the coolant due to such corrosion.

DETAILED DESCRIPTION OF THE EMBODIMENTS

Hereinafter, embodiments of the present invention will be described with reference to the drawings.

<<First Embodiment>>

The semiconductor device according to the present embodiment comprises: one or more semiconductor elements, such as switching elements or diodes; a heat sink on which the semiconductor elements are mounted; and a cooling component for cooling the heat sink. Such a semiconductor device can convert a direct current from a direct current source into a three-phase alternate current by controlling ON/OFF of the switching elements. For example, such a semiconductor device can be used in an inverter device which supplies electrical power to a driving motor for an electric vehicle, such as hybrid car and fuel-cell car.

Figure 1:
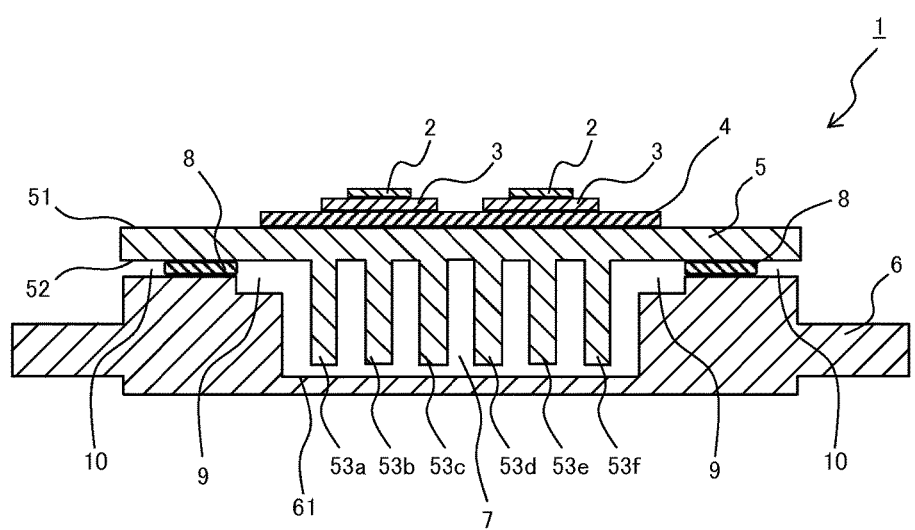
FIG. 1 is a cross-sectional view showing a semiconductor device according to a first embodiment.

FIG. 1 is a cross-sectional view showing a semiconductor device according to a first embodiment. As shown in FIG. 1, semiconductor device 1 according to the present embodiment includes semiconductor elements 2, electrode pads 3, an insulating layer 4, a heat sink 5, a cooling component 6, and a sealing member 8. In the semiconductor device 1, the heat sink 5 and the cooling component 6 form a coolant passage 7 in which a coolant flows to cool the heat sink 5, and the semiconductor elements 2 mounted on the heat sink 5 can be cooled indirectly.

Although not shown in FIG. 1, the semiconductor device 1 of the present embodiment is ordinarily provided with another set of electrode pads 3, an insulating layer 4, a heat sink 5 and a cooling component 6 which are placed on upper surfaces of the semiconductor elements 2 (opposite surfaces to the surfaces on which the electrode pads 3 are provided in FIG. 1). That is, the semiconductor device 1 has a configuration in which both of the upper surfaces and the lower surfaces of the semiconductor elements 2 (both of the surfaces on which the electrode pads 3 are provided and the opposite surfaces in FIG. 1) are interposed between a pair of sets each comprising the electrode pads 3, the insulating layer 4, the heat sink 5, and the cooling component 6. This allows each semiconductor element 2 to be connected with a pair of the electrode pads 3 and cooled from both the upper and lower surfaces by the heat sinks 5 and the cooling components 6 via the insulating layers 4.

Each semiconductor element 2 as a cooling target comprises a transistor or diode, such as an IGBT (Insulated Gate Bipolar Transistor), which constitutes a part of a three-phase inverter bridge circuit. A pair of the electrode pads 3 is connected with the semiconductor element 2 via solder layers formed by soldering on both the upper and lower surfaces of the semiconductor element 2. The semiconductor element 2 is interposed between a pair of the heat sinks 5 via the insulating layers 4. In addition, the semiconductor element 2 is electrically connected with respective electrode pads 3 through which electrical power can be input/output. In the present embodiment, since the semiconductor element 2 generates heat due to current flow, the generated heat is to be removed through the heat sinks 5, as will be described below. The semiconductor element 2 is not limited to a transistor or diode such as an IGBT, and other heat-generating elements may also be employed. The electrode pads 3 to be used may be formed of, for example, copper or aluminum which has good electrical conductivity.

As shown in FIG. 1, the heat sink 5 is configured to have a main surface 51 on which the above-described insulating layer 4, electrode pads 3 and semiconductor elements 2 are provided in this order and a heat radiation surface 52 formed with heat radiation fins 53a to 53f. The heat sink 5 receives the heat generated due to current flow in the semiconductor elements 2 at the main surface 51 via the insulating layer 4, and then radiates the received heat from the heat radiation fins 53a to 53f on the heat radiation surface 52.

In the embodiment shown in FIG. 1, an example is described in which six heat radiation fins 53a to 53f are provided on the heat radiation surface 52, but the number of the heat radiation fins is not particularly limited, and any desirable number of the heat radiation fins can be employed. The form of the heat radiation fins is also not particularly limited. The heat sink 5 to be used may be formed of an appropriate material, for example, such as copper, aluminum or aluminum alloy, which has good heat conductivity. In addition, the heat sink 5 may be provided with a plating layer, such as a nickel layer, on the surface. The insulating layer 4 to be used may be a ceramic substrate formed of ceramic having electrical insulating property, an insulating sheet, or the like.

The cooling component 6 is joined or combined with the above-described heat sink 5 so as to form the coolant passage 7 through which the coolant flows to cool the heat sink 5. As shown in FIG. 1, the cooling component 6 faces the heat radiation surface 52 of the heat sink 5. As shown in FIG. 1, the cooling component 6 is provided with a recess 61. The recess 61 is joined or combined with the above-described heat sink 5 so as to form the coolant passage 7 through which the coolant flows to cool the heat sink 5.

The sealing member 8 is interposed between the cooling component 6 and the heat sink 5 to seal the coolant passage 7. One surface of the sealing member 8 contacts with the heat sink 5, whereas the other surface of the sealing member 8 contacts with the cooling component 6. This results in the sealing member 8 being pressed from both surfaces between the heat sink 5 and the cooling component 6 so as to be in close contact with the heat sink 5 and the cooling component 6, and the coolant passage 7 can be sealed with the sealing member 8. The sealing member 8 may be, for example, a seal ring such as an O-ring of rubber material, a liquid-like gasket, a metal gasket, or the like.

When the coolant passage 7 is sealed with the sealing member 8, an interior gap 9 of the coolant passage and an exterior gap 10 of the coolant passage are formed near (either side) the sealing member 8, as shown in FIG. 1. More specifically, the interior gap 9 of the coolant passage, which is a gap between the heat sink 5 and the cooling component 6, is formed at the interior side of the coolant passage 7 separated by the sealing member 8, whereas the exterior gap 10 of the coolant passage, which is a gap between the heat sink 5 and the cooling component 6, is formed at the exterior side of the coolant passage 7 separated by the sealing member 8.

According to the present embodiment, the heat sink 5 is cooled by the cooling component 6 in the following manner. First, the coolant is continuously introduced into the coolant passage 7 from an inlet pipe (not shown in drawings) provided in the cooling component 6. Then, the introduced coolant comes into contact with the heat radiation fins 53a to 53f of the heat sink 5 in the coolant passage 7 to perform heat exchange and cool the heat sink 5. Thereafter, the coolant is continuously discharged from an outlet pipe (not shown in drawings). The cooling component 6 may be made of a raw material, such as copper, aluminum or aluminum alloy which has good heat conductivity and may be molded, for example, such as by die-casting or extrusion molding. The coolant may be liquid, such as cooling water or LLC (Long Life Coolant).

Figure 2:
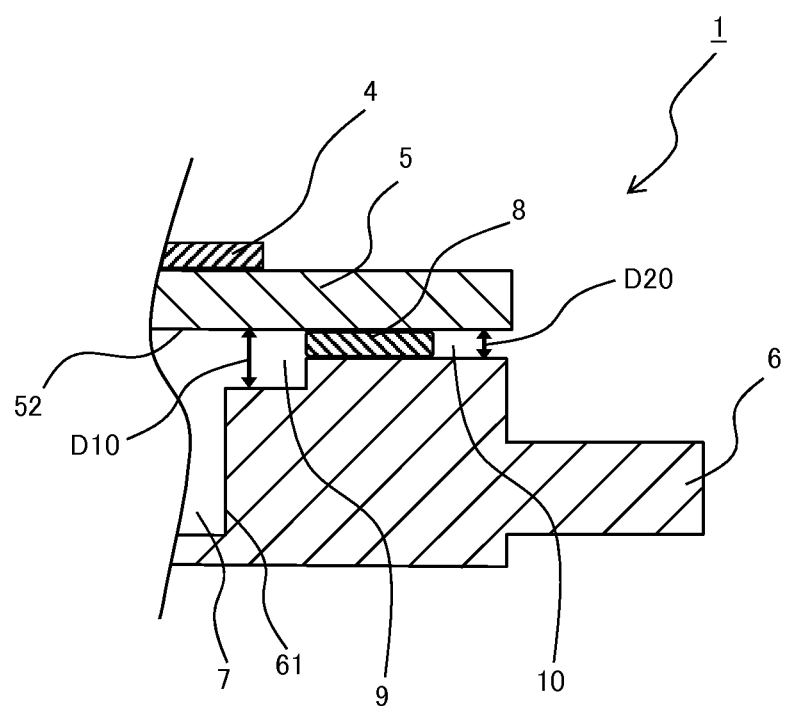
FIG. 2 is an enlarged view of the semiconductor device according to the first embodiment.

FIG. 2 is an enlarged view near the sealing member 8 in the semiconductor device 1 shown in FIG. 1. As shown in FIG. 2, a step is provided at the interior side of the coolant passage 7 near the sealing position. Therefore, comparing an interior facing distance D10 and an exterior facing distance D20 each of which is a distance between facing surfaces (surfaces of the heat sink 5 and the cooling component 6 facing each other), the interior facing distance D10 is longer than the exterior facing distance D20, as shown in FIG. 2. More specifically, with regard to the distances between the facing surfaces of the heat sink 5 and the cooling component 6 near (either side) the sealing member 8, the interior facing distance D10, which is a distance between the facing surfaces at the interior side of the coolant passage 7 separated by the sealing member 8, is longer than the exterior facing distance D20, which is a distance between the facing surfaces at the exterior side of the coolant passage 7 separated by the sealing member 8.

Thus, according to the present embodiment, the interior facing distance D10 is designed longer than the exterior facing distance D20 so as to allow the coolant to smoothly flow in the interior gap 9 of the coolant passage, and advantageous effects can be obtained as follows. That is, the coolant is allowed to smoothly flow in the interior gap 9 of the coolant passage, and the coolant as a whole is made uniform in the coolant passage 7, so that a concentration cell is prevented from being formed in the coolant passage 7 due to the concentration difference of the residual oxygen. This can effectively prevent corrosion of the heat sink 5 and the cooling component 6 and prevent leakage of the coolant due to such corrosion.

Figure 3:
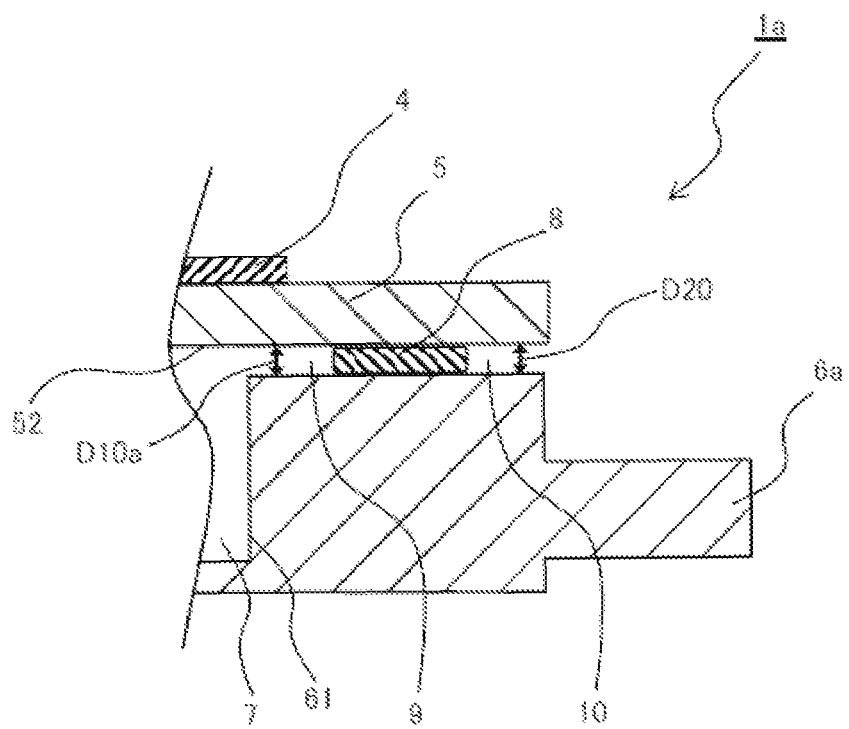
FIG. 3 is an enlarged view of a conventional semiconductor device.

On the other hand, as in a conventional semiconductor device 1a shown in FIG. 3, if the interior facing distance D10a is relatively short, the coolant will be impeded from flowing in the interior gap 9 of the coolant passage. In the semiconductor device 1a, therefore, a concentration cell may be formed due to the concentration difference of the residual oxygen to cause corrosion of the heat sink 5 and the cooling component 6. More specifically, first, when the coolant flows in the semiconductor device 1a, an increased dissolved oxygen concentration promotes the reduction reaction of oxygen represented by the following general formula (1). And a further reaction also progresses such that metals are dissolved into the coolant from components, such as the heat sink 5 and the cooling component 6a, which are in contact with the coolant. For this reason, the coolant to flow in the semiconductor device 1a may ordinarily be used after preliminarily degassing the oxygen dissolved in the coolant. However, even in a case of using the coolant after degassing the oxygen, when the coolant is circulated in the semiconductor device 1a, oxygen is dissolved into the coolant to increase the dissolved oxygen concentration in the coolant. This will be more specifically described. The semiconductor device 1a is configured to be connected via pipes with a pump, valves, an expansion tank (pressure-adjusting bath) and other necessary components, through which the coolant is circulated. When the coolant is circulated in such a configuration, the coolant comes into contact with air while passing through the pump, valves, expansion tank and other components, and oxygen is dissolved into the coolant to raise the dissolved oxygen concentration in the coolant. If, in this case, the interior facing distance D10a is relatively short, the coolant will be impeded from flowing in the interior gap 9 of the coolant passage, so that the coolant will stay there. Accordingly, a low dissolved oxygen concentration may be maintained in the coolant staying, whereas the dissolved oxygen concentration may be raised in the coolant circulating smoothly in other passes in the coolant passage 7 than the interior gap 9 of the coolant passage. Therefore, this will cause a difference in the concentration of the dissolved oxygen in the coolant. If a difference in the concentration of the dissolved oxygen is caused in the coolant, a concentration cell will be formed in the coolant passage 7 to cause corrosion of the heat sink 5 and the cooling component 6.

(1)

Specifically, in the heat radiation surface 52 of the heat sink 5, electrons move from areas on which the coolant of a low dissolved oxygen concentration is present (areas near the interior gap 9 of the coolant passage) to areas on which the coolant of a high dissolved oxygen concentration is present (other areas than the interior gap 9 of the coolant passage). This results in forming a concentration cell in the coolant passage 7. When electrons move in such a manner, a reaction also progress in accordance with the following general formula (2) such that metals which constitute the heat sink 5 dissolve into the coolant. As the reaction of general formula (2) progresses, local corrosion (crevice corrosion) progresses in the heat sink 5. Moreover, as the metals which constitute the heat sink 5 dissolve into the coolant, the dissolved metal ions react with chloride ions contained in the coolant (e.g., chloride ions dissolved in the cooling water or LLC as the coolant) to generate metal chloride as represented by the following general formula (3). Thereafter, the generated metal chloride is hydrolyzed in the coolant in accordance with the following general formula (4) to generate hydrogen ions. This generation of hydrogen ions lowers the pH in the coolant to corrode the cooling component 6a. Furthermore, if a plating layer is formed on a surface of the heat sink 5 and/or of the cooling component 6a, the corrosion will progress to delaminate the plating layer. The delamination of the plating layer or the like causes the liquid leakage from the sealing position.

(2)

(3)

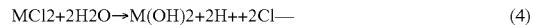

(4)

In the above formulae (2), (3), and (4), M is a metal which constitutes the heat sink 5.

In contrast, according to the present embodiment, the interior facing distance D10 is designed longer than the exterior facing distance D20 so as to allow the coolant to smoothly flow in the interior gap 9 of the coolant passage. Therefore, in the present embodiment, it is possible to prevent the occurrence of concentration difference of the dissolved oxygen in the coolant and the formation of a concentration cell in the coolant passage 7. Thus, according to the present embodiment, the formation of a concentration cell is avoided, and it is possible to effectively prevent corrosion of the heat sink 5 and the cooling component 6 and prevent leakage of the coolant due to such corrosion.

In particular, according to the present embodiment, an additional process is not required, such as forming a coating film for the heat sink 5 and the cooling component 6, to prevent corrosion of the heat sink 5 and cooling component 6. Therefore, corrosion of the heat sink 5 and the cooling component 6 can be prevented in a simplified manner at low cost.

Moreover, according to the present embodiment, the interior facing distance D10 is designed longer than the exterior facing distance D20 so as to effectively prevent corrosion of the heat sink 5 and the cooling component 6 even in a case in which the heat sink 5 and the cooling component 6 are fastened to each other using screws. This will be more specifically described. When the heat sink 5 and the cooling component 6 are fastened to each other using screws, the heat sink 5 and the cooling component 6 come close to each other, so that both of the interior facing distance D10 and the exterior facing distance D20 are shortened. In this case, the heat sink 5 and the cooling component 6 first come into contact with each other at the exterior side of the coolant passage 7 associated with the exterior facing distance D20 which is a shorter distance.

Therefore, the heat sink 5 and the cooling component 6 can be prevented from coming into contact with each other at the interior side of the coolant passage 7 associated with the interior facing distance D10 which is a longer distance. This can prevent corrosion of the base material of the heat sink 5 and/or of the cooling component 6 even in a case in which a plating layer or the like is provided on a surface of the heat sink 5 and/or of the cooling component 6 because, in the coolant passage 7, crack and damage of the plating layer or the like due to contact between the heat sink 5 and the cooling component 6 can be avoided.

In addition, according to the present embodiment, the interior facing distance D10 is designed longer than the exterior facing distance D20 so as to prevent the heat sink 5 and the cooling component 6 from coming into contact with each other in the coolant passage 7 even when warpage occurs in the heat sink 5 due to the temperature load caused by heat generation from the semiconductor elements 2. This can prevent corrosion of the base material of the heat sink 5 and/or of the cooling component 6 even in a case in which a plating layer or the like is provided on a surface of the heat sink 5 and/or of the cooling component 6 because, in the coolant passage 7, crack and damage of the plating layer or the like due to contact between the heat sink 5 and the cooling component 6 can be avoided.

In the above-described example shown in FIG. 1 and FIG. 2, the cooling component 6 of the semiconductor device 1 is exemplified in which a step is provided at the interior side of the coolant passage 7 near the sealing position. However, the form of the cooling component 6 is not particularly limited to such an example, and any form may be employed provided that the interior facing distance D10 is longer than the exterior facing distance D20.

In the present embodiment, the form of the cooling component may be designed as a slope structure in which the interior facing distance D10 is longer as approaching the recess from the sealing position side. For example, as in a cooling component 6b of a semiconductor device 1b shown in FIG. 4, the cooling component 6b may be formed with a gentle or moderate slope at a peripheral part of the recess 61. The cooling component may also be formed into a C chamfered shape or R (round) chamfered shape (fillet shape) such that a corner portion of the peripheral part of the recess 61 is removed.

According to the present embodiment, the cooling component is formed such that the interior facing distance D10b is longer as approaching the recess from the sealing position side, so that the coolant flows more smoothly in the interior gap 9 of the coolant passage. According to the present embodiment, therefore, it is possible to more effectively prevent corrosion of the heat sink 5 and the cooling component 6b and leakage of the coolant due to such corrosion.

In the present embodiment, the cooling component 6b may be formed such that the interior facing distance D10b at a position closest to the sealing position (i.e., the interior facing distance D10b which is the minimum distance) is designed longer than the exterior facing distance D20.

In addition, since the interior facing distance D10b is longer as approaching the recess from the sealing position side, it is possible to more effectively prevent corrosion of the base material of the heat sink 5 and/or of the cooling component 6. More specifically, since the interior facing distance D10b is longer as approaching the recess from the sealing position side, it is possible to more effectively prevent the heat sink 5 and the cooling component 6 from coming into contact with each other in the coolant passage 7 even in a case in which the heat sink 5 and the cooling component 6 are fastened to each other using screws and in the case that warpage occurs in the heat sink 5 due to the temperature load caused by heat generation from the semiconductor elements 2. This can more effectively prevent corrosion of the base material of the heat sink 5 and/or of the cooling component 6 because, in the coolant passage 7, crack and damage of the plating layer or the like due to contact between the heat sink 5 and the cooling component 6 can be avoided.

<<Second Embodiment>>

Figure 5:
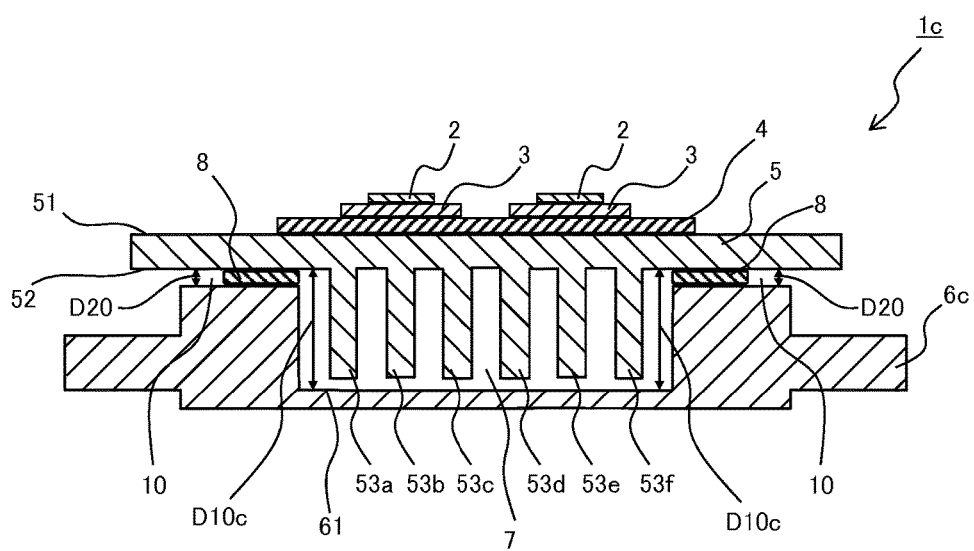
FIG. 5 is a cross-sectional view showing a semiconductor device according to a second embodiment.

A second embodiment of the present invention will then be described. Semiconductor device 1c according to the second embodiment has the same configuration as that of the semiconductor device 1 according to the first embodiment except that the form of a cooling component 6c is different, as shown in FIG. 5. In the semiconductor device 1c, the cooling component 6c is formed such that the sidewall of the recess 61 is substantially coplanar with the end face of the sealing member 8.

According to the present embodiment, the cooling component 6c is formed in the above-described manner so as to allow the interior facing distance D10c to be longer. As described above, the interior facing distance D10c is a distance between the facing surfaces of the heat sink 5 and the cooling component 6 near the seal member 8 at the interior side of the coolant passage 7 separated by the sealing member 8. Therefore, since the sidewall of the recess 61 is formed to be substantially coplanar with the end face of the sealing member 8, it is possible that the interior facing distance D10c is longer.

According to the second embodiment, the following advantageous effect can be obtained in addition to the above-described advantageous effects by the first embodiment. In the present embodiment, since the cooling component 6c is formed such that the recess 61 is substantially coplanar with the end face of the sealing member 8, it is possible that the interior facing distance D10c is longer. This allows the coolant to more smoothly flow in the interior gap 9 of the coolant passage, and it is possible to more effectively prevent corrosion of the heat sink 5 and the cooling component 6c and leakage of the coolant due to such corrosion in the present embodiment.

<<Third Embodiment>>

Figure 6A:
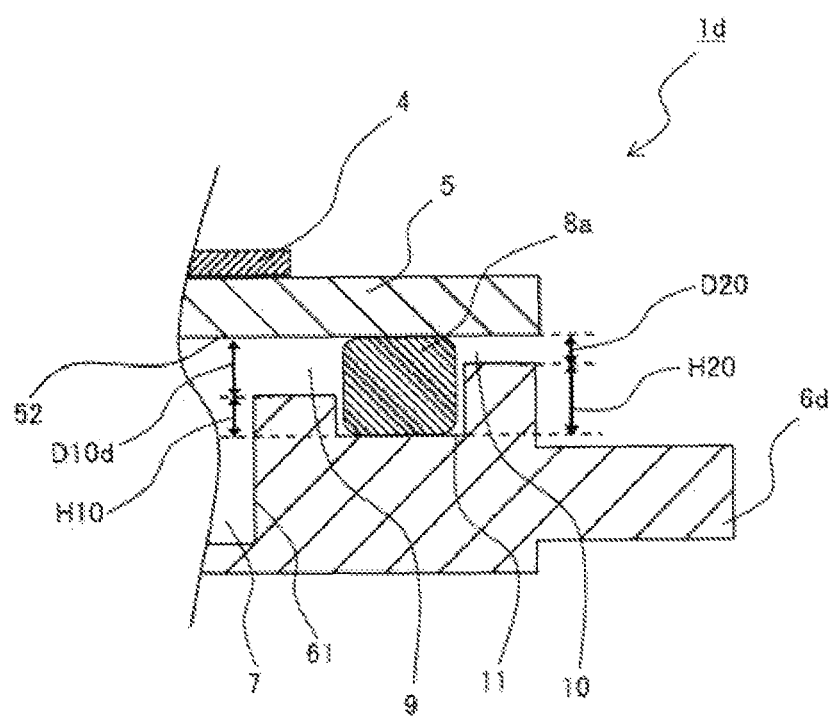
FIGS. 6A and 6B are enlarged views of a semiconductor device according to a third embodiment.

A third embodiment of the present invention will then be described. Semiconductor device 1d according to the third embodiment has the same configuration as that of the semiconductor device 1 according to the first embodiment except that, as shown in FIG. 6A, an O-ring is necessarily used as a sealing member 8a and a cooling component 6d is formed with a sealing groove 11 in which an O-ring (the sealing member 8a) is provided. FIG. 6A is an enlarged view near the sealing member 8a in the semiconductor device 1d according to the present embodiment.

In the present embodiment, the cooling component 6d is configured as shown in FIG. 6(A). As shown in FIG. 6A, with regard to the protruding amount of the sidewall of the sealing groove 11 from the bottom of the sealing groove 11, the protruding amount at the interior side of the coolant passage 7 separated by the sealing member 8a is smaller than the protruding amount at the exterior side of the coolant passage 7 separated by the sealing member 8. More specifically, in the cooling component 6d shown in FIG. 6A, the height of the sidewall at the interior side of the coolant passage 7 (interior sidewall height H10) is lower than the height of the sidewall at the exterior side of the coolant passage 7 (exterior sidewall height H20). This allows the interior facing distance D10d to be longer than the exterior facing distance D20 in the present embodiment as shown in FIG. 6A, so that the coolant can smoothly flow in the interior gap 9 of the coolant passage.

According to the third embodiment, the following advantageous effect can be obtained in addition to the above-described advantageous effects by the first embodiment. In the present embodiment, since the sealing groove 11 is formed in the cooling component 6d, and the sealing member 8a as an O-ring can be fixed in the groove to improve the water tightness. In addition, according to the present embodiment, the interior sidewall height H10 is designed lower than the exterior sidewall height H20 so as to allow the coolant to smoothly flow in the interior gap 9 of the coolant passage. According to the present embodiment, therefore, it is possible to effectively prevent corrosion of the heat sink 5 and the cooling component 6d and leakage of the coolant due to such corrosion.

In the present embodiment, the form of the sidewall at the interior side of the coolant passage 7 may have a slope in which the interior facing distance D10 is longer as approaching the recess from the sealing position side. In this case, similar to a cooling component 6e of a semiconductor device 1e shown in FIG. 6B, the sidewall at the interior side of the coolant passage 7 may be formed with a gentle or moderate slope. The sidewall at the interior side of the coolant passage 7 may also be formed into a C chamfered shape or R (round) chamfered shape (fillet shape) such that a corner portion of the peripheral part of the recess 61 is removed.

Figure 4:
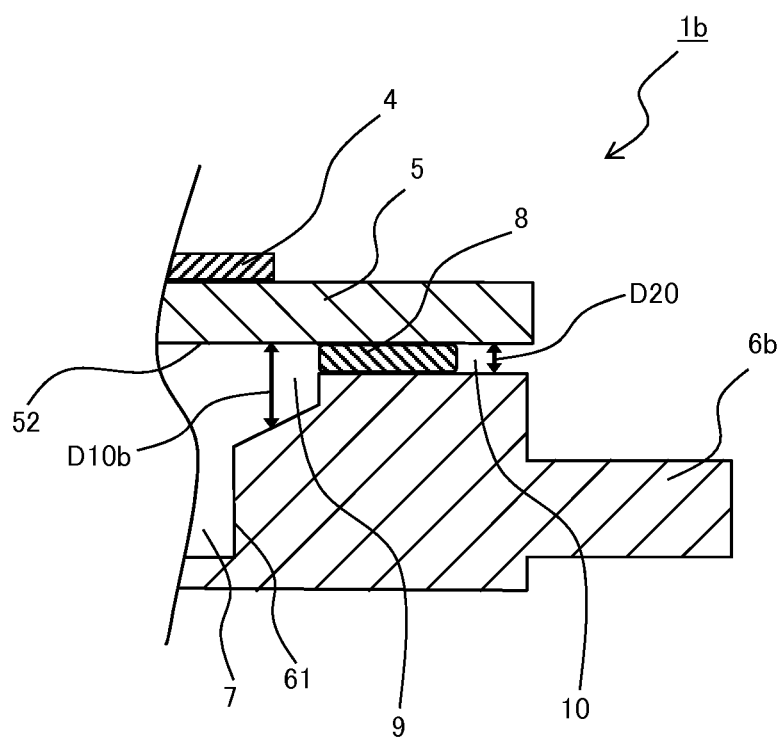
FIG. 4 is an enlarged view showing another example of a semiconductor device according to the first embodiment.

According to the present embodiment, since the interior facing distance D10e is longer as approaching the recess from the sealing position side, it is possible to allow the coolant to more smoothly flow in the interior gap 9 of the coolant passage as in the above-described semiconductor device 1b shown in FIG. 4. According to the present embodiment, therefore, it is possible to more effectively prevent corrosion of the heat sink 5 and the cooling component 6e and prevent leakage of the coolant due to such corrosion. In the case that the interior facing distance D10e is longer as approaching the recess from the sealing position side, it is possible to more effectively prevent corrosion of the base material of the heat sink 5 and/or of the cooling component 6e. Because, in the coolant passage 7, crack and damage of the plating layer or the like due to contact between the heat sink 5 and the cooling component 6e can be avoided.

In this case, the cooling component 6e may be formed such that the interior facing distance D10e at a position closest to the sealing position (i.e., the interior facing distance D10e which is the minimum distance) is designed longer than the exterior facing distance D20.

Figure 6B:
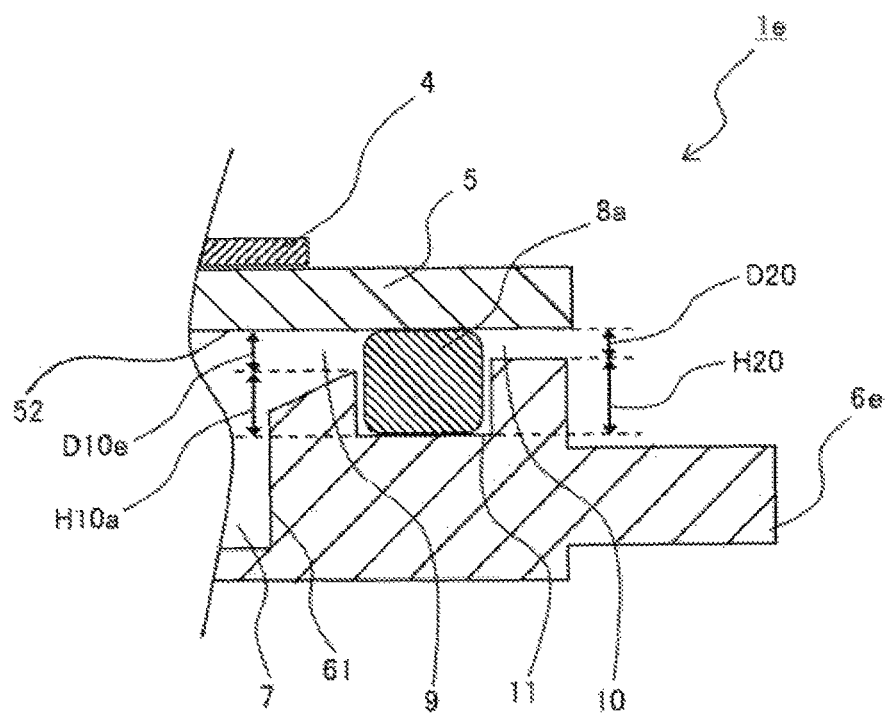

Furthermore, in the semiconductor device 1e shown in FIG. 6B, since the interior facing distance D10e is longer as approaching the recess from the sealing position side, it is possible to further improve the water tightness by the sealing member 8a. More specifically, in the semiconductor device 1e, as shown in FIG. 6B, the interior sidewall height H10a can be higher as approaching the sealing member 8a. Therefore, even when the sealing member 8a is compressed in the sealing groove 11, the sealing member 8a does not come out of the sealing groove 11, and the water tightness by the sealing member 8a can thus be improved.

Embodiments of the present invention have been heretofore explained, but these embodiments are described to facilitate understanding of the present invention and are not described to limit the present invention. Therefore, it is intended that the elements disclosed in the above embodiments include all design changes and equivalents to fall within the technical scope of the present invention.

The heat sink 5 in the above-described embodiments corresponds to the heat sink in the present invention. The cooling component 6 in the above-described embodiments corresponds to the cooling component in the present invention. The sealing member 8 in the above-described embodiments corresponds to the sealing member in the present invention. The sealing groove 11 in the above-described embodiments corresponds to the sealing groove in the present invention.

What is claimed is:

1. A cooling apparatus for a heat-generating element, comprising:
    a heat sink having a main surface on which the heat-generating element is mounted and a heat radiation surface from which heat generated by the heat-generating element is radiated;
    a cooling component having a recess and an interior gap, the recess having an outer sidewall extending in a substantially perpendicular direction to the heat sink, the interior gap being defined by an interior gap plane and an exterior gap plane, the interior gap plane being coplanar with the outer sidewall, the cooling component and the heat sink facing and joining each other so that the recess forms a coolant passage in which a coolant flows; and
    a sealing member provided between the heat sink and the cooling component so as to seal the coolant passage and separate an interior and exterior of the coolant passage, the sealing member having an internal side and an external side, the internal side being adjacent to the coolant passage, wherein
    the sealing member is provided outside a plane which is coplanar with a first sidewall of the recess such that the internal side of the sealing member is coplanar with the interior gap plane,
    a first distance is longer than a second distance with regard to a distance between facing surfaces of the heat sink and the cooling component near the sealing member,
    the first distance is a distance between the facing surfaces within the interior gap between the sealing member and the first sidewall of the recess at an interior side of the coolant passage separated by the sealing member, the first distance having a minimal value at a point of the cooling component closest to the sealing member, and
    the second distance is a distance between the facing surfaces at an exterior side of the coolant passage separated by the sealing member.

2. The cooling apparatus for a heat-generating element according to claim 1,
    wherein the cooling component has a sealing groove in which the sealing member is provided,
    a first height is lower than a second height,
    the first height is a height of a second sidewall from a bottom of the sealing groove at the interior side of the coolant passage separated by the sealing member, and
    the second height is a height of the second sidewall from a bottom of the sealing groove at the exterior side of the coolant passage separated by the sealing member.

3. The cooling apparatus for a heat-generating element according to claim 1, wherein the cooling component has a slope in which the first distance is longer as approaching the recess from a sealing position side.

4. The cooling apparatus for a heat-generating element according to claim 3, wherein the slope is configured such that a peripheral edge of the recess has a round chamfered shape.

5. The cooling apparatus for a heat-generating element according to claim 1, wherein the first distance is longer than the second distance at any position within a region between the sealing member and the first sidewall at the interior side of the coolant passage separated by the sealing member.

6. The cooling apparatus for a heat-generating element according to claim 1, wherein the first distance is substantially the same at any two positions within a region between the sealing member and the first sidewall at the interior side of the coolant passage separated by the sealing member.

* * * * *